United States Patent
Farnworth et al.

(10) Patent No.: US 6,202,292 B1
(45) Date of Patent: *Mar. 20, 2001

(54) APPARATUS FOR REMOVING CARRIER FILM FROM A SEMICONDUCTOR DIE

(75) Inventors: Warren M. Farnworth, Nampa; Rockwell Smith, Boise, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,920

(22) Filed: Aug. 26, 1998

(51) Int. Cl.[7] .............................. B23P 19/00; B25B 11/00
(52) U.S. Cl. .................................. 29/743; 29/762; 269/21
(58) Field of Search ........................ 29/762, 743, 21

(56) References Cited

U.S. PATENT DOCUMENTS

| | | |
|---|---|---|
| 4,285,433 | 8/1981 | Garrett, Sr. et al. . |
| 4,607,744 | 8/1986 | Pak . |
| 4,759,675 | 7/1988 | Bond et al. . |
| 4,778,326 | 10/1988 | Althouse et al. . |
| 4,850,780 | 7/1989 | Safabakhsh et al. . |
| 4,915,565 | 4/1990 | Bond et al. . |
| 4,990,051 | 2/1991 | Safabakhsh et al. . |
| 5,018,938 * | 5/1991 | Sikorski ............................. 414/786 |
| 5,417,408 * | 5/1995 | Ueda ....................................... 269/21 |
| 5,423,716 * | 6/1995 | Strasbaugh .............................. 269/21 |
| 5,590,787 | 1/1997 | Hodges . |
| 5,648,136 | 7/1997 | Bird . |
| 5,692,873 * | 12/1997 | Weeks et al. ........................... 269/21 |
| 5,765,277 * | 6/1998 | Jin et al. ................................ 29/743 |

FOREIGN PATENT DOCUMENTS

| | | | |
|---|---|---|---|
| 092010336 * | 6/1992 | (GB) | ....................................... 269/21 |
| 0046529 * | 4/1981 | (JP) | ....................................... 269/21 |
| 0 102 848 * | 5/1988 | (JP) | ....................................... 269/21 |
| 0 205 441 * | 8/1989 | (JP) | ....................................... 269/21 |
| 0 106 239 * | 4/1990 | (JP) | ....................................... 269/21 |
| 405285765 * | 11/1993 | (JP) | ....................................... 269/21 |
| 405301137 * | 11/1993 | (JP) | ....................................... 269/21 |

* cited by examiner

Primary Examiner—S. Thomas Hughes
Assistant Examiner—Jermie E. Cozart
(74) Attorney, Agent, or Firm—Trask Britt

(57) ABSTRACT

An apparatus which reduces the surface area with which a carrier film adheres to a die, including a plate member including laterally-spaced supports. Preferably, the apparatus also includes a vacuum source operatively connected to the plate member. Upon placement of a carrier film having an array of semiconductor dice adhered thereto onto the plate member, the dice are proximate the supports. The vacuum pulls air from the spaces between the supports, which partially releases the carrier film from the bottom surface of at least some of the dice. The apparatus may also include a die removal mechanism such as a vacuum collet type die pick-up mechanism, an extendable member die plunge-up mechanism, or a combination thereof. The present invention also includes a method for reducing the surface area with which a carrier film adheres to a die to facilitate removal thereof.

14 Claims, 7 Drawing Sheets

APPARATUS FOR REMOVING CARRIER FILM FROM A SEMICONDUCTOR DIE

BACKGROUND OF THE INVENTION

1. Field of the Invention

The present invention relates to apparatus for removal of a carrier film from the bottom surface of semiconductor dice and other electronic devices. Particularly, the apparatus of the present invention reduces the surface area of the adhesive film which remains in contact with a die during removal. The present invention also relates to a method for removing semiconductor dice and other electronic devices from carrier film.

2. Background of Related Art

Several apparatus and methods are known for removing semiconductors and other electronic devices from adhesive carriers such as film. Some such methods involve degrading the adhesive properties of the carrier. Some devices employ needles, pistons, or other mechanisms which apply an upward force to push the die off of the carrier. Other devices utilize a vacuum to pull a die from a carrier. Many known apparatus and methods for removing a die from a carrier cause damage to a significant quantity of dice.

U.S. Pat. No. 4,778,326, issued in the names of Althouse et al., discloses method and apparatus for transporting semiconductor dice which is commonly referred to as a "gel pack" or "die-pac." The semiconductor dice are loaded onto and adhere to a flat, thin, flexible silicone film, which is attached to a carrier base. The carrier base has recesses formed therein, into which the silicone film may be pulled as a vacuum is applied beneath the film. As the film is pulled into the recesses, the area of the silicone film which contacts the dice is reduced, thereby reducing the magnitude of the adherence by which the dice are attached to the film. The dice may then be easily removed with a vacuum tip.

As mentioned above, the predominant use of gel packs is to transport dice. No semiconductor fabrication processes are performed while dice are on a gel pack. Use of gel packs is somewhat undesirable because the silicone of the films tends to contaminate dice by leaving a silicone residue thereon.

U.S. Pat. No. 5,590,787, issued in the name of Hodges, discloses another die-pac device for transporting semiconductor dice. The device of the '787 patent includes a UV sensitive adhesive and permits the penetration of electromagnetic radiation, such as ultraviolet light, therethrough.

Techniques which utilize carrier films having ultraviolet light (UV) degradeable adhesives thereon or other degradeable adhesives are also well known in the art. The area of film attached to a die which has been selected for further manufacture is irradiated with the appropriate degradative source to remove the die from the film. Although the use of UV radiation and similar methods are desirable from the standpoint that they are unlikely to damage the die, the adhesives and carrier films required for such devices and processes are very expensive. UV-release carrier tapes have also been employed to a limited extent with gallium arsenide dice.

U.S. Pat. Nos. 4,990,051 and 4,850,780, each of which issued in the names of Safabakhah et al., each describe an apparatus for removing a die from an adhesive carrier film. That apparatus concurrently applies a vacuum to the exposed surface of the die and a chuck to the film on the opposite surface of the die. The vacuum collett is moved away from the chuck, which facilitates a pre-peel of a small area of the film from the periphery of the die. A piston disposed coaxially within the chuck is then forced against the carrier film to stretch the film and further reduce the area of the film which adheres to the die, thereby facilitating removal of the die from the film.

Some other apparatus for removing dice from a carrier film include a plunge-up piston which has a cap thereon to raise a select die in relation to the adjacent dice on the film. This process is referred to as "tenting" the film. A needle disposed within the cap is actuated to contact the die from below and push it from the carrier film as a vacuum tip positioned above the die pulls the select die away from the film.

Such tenting processes for removing dice from film are undesirable for several reasons. First, tenting sometimes creates an air bubble under the die, which tends to tilt the die, preventing the vacuum tip from obtaining a good hold on the die. In such cases, the vacuum tip will likely drop the select die, damaging and/or contaminating the die. Second, in many such apparatus, the needles which push the select die from the film have pointed ends, which tend to score the bottom surface of the die. Dice which have been scored in such a manner tend to subsequently fail mechanically at the location where they have been scored. Third, as the film is tented, the edges of other dice which are adjacent to the select die may be chipped, causing damage to the circuitry on their active surfaces, with consequential failure.

U.S. Pat. No. 4,915,565, issued in the names of Bond et al., discloses an apparatus for removing a selected die from a wafer having an array of dice which are attached to a carrier film. In the apparatus of the '565 patent, the dice are positioned beneath the film during removal of each selected die. A head having an array of needles protruding therefrom is positioned over the film opposite a selected die. In operation, the head plunges toward the film, the needles penetrating the carrier film and dislodging the die from the film. The dislodged die then falls into a receptacle. U.S. Pat. No. 4,759,675, issued in the names of Bond et al., discloses the same die removal device.

The sole use of needles to remove a select die from a carrier film makes the removal device of the '565 and '675 patents undesirable. The adhesive forces of the film to the die necessitate a large amount of force for removing the die therefrom. Further, the orientation of the plunge head relative to the die requires that the die suffer some impact when falling into a receptacle, increasing the likelihood of damage to the die.

U.S. Pat. No. 4,285,433, issued in the names of Garrett, Sr. et al., describes another method and apparatus for selecting and removing singulated dice from a wafer. The apparatus includes an adhesive film which is attached to the bottom of the carrier film supporting the dice. The adhesive film with adhered carrier film is pulled away from the dice through a slot. U.S. Pat. No. 4,607,744, issued in the name of Pak, discloses a similar method and device which removes carrier film from dice with a take-up drum which pulls a free end of the carrier film. The carrier film is pulled around a separator edge into a slot, the dice then passing over the separator edge and onto a conveyer which transports the dice away from the separator edge.

The amount of force applied to the dice as the carrier film is pulled downward through such a slot or separator edge while the dice proceed in a different direction of travel may be sufficient to break or damage the dice. Further, the processes of the '433 and '744 patents are undesirable in that they do not permit automated removal of selected dice from an array of dice including failed dice and die fragments as well as functional dice.

As dice become thinner and are fabricated with larger surface areas (which adhere to a greater area of the carrier film), the likelihood of their being damaged by each of the foregoing mechanical removal processes increases.

Thus, an apparatus is needed for removing disposable carrier tape or film from semiconductor dice and other electronic devices which exerts little or no impact on a die, reduces the area of carrier tape or film adhered to a die before removal of the die, and utilizes an inexpensive yet effective carrier tape or film.

SUMMARY OF THE INVENTION

In contrast to the deficiencies exhibited by the prior art, the low-stress die removal system of the present invention addresses each of the foregoing needs. The apparatus is useful with many disposable carrier tapes or films known and used in the art. The apparatus also exerts little, if any, impact on the die. The apparatus of the present invention also significantly reduces the surface area of carrier film adhered to a die before removal. The die removal apparatus does not require the use of expensive films which have degradeable adhesives thereon.

One embodiment of the die removal apparatus of the present invention includes a base, including a plate member encircled by a raised periphery, a screen disposed over the plate member, and a vacuum source to create a vacuum within the base and below the screen. The plate member may include recesses therein to ensure application of the vacuum to all portions of the base within the periphery. A carrier film having dice on the upper surface thereof is placed above the plate, and the vacuum used to pull the film against the screen and away from the dice.

In a variation of the die removal apparatus of the present invention, the plate member includes a series of laterally-spaced supports protruding upwardly therefrom. The portions of the screen which overlay the supports may be higher than those portions which rest within the recesses. Another variation of the base of the die removal apparatus of the present invention lacks a screen and merely employs supports. Alternatively, a plate member may be formed with apertures therethrough and the film is pulled thereagainst and within the apertures upon activation of the vacuum source. In yet another variation, the upper face of the plate is provided with bumps, convolutions, or other protuberances separated by valleys into which the carrier film may be pulled.

In use, a frame ring which engages a carrier film with a wafer thereon is positioned over the base. The film preferably rests upon and is supported by the plate member. As the vacuum source is activated, the portions of the carrier film which overlay the recesses are pulled against the screen, supports, or protuberances and into the recesses or valleys. Thus, the area of the film which remains adhered to the dice is reduced by an amount which depends upon the size of the recesses and the strength of the vacuum. Consequently, the adherence of each of the dice to the carrier film is reduced. Dice which have been selected for further processing (referred to individually as a "select die") are then completely separated from the carrier film by a removal mechanism, which removes each select die by pushing, pulling, or pushing and pulling each select die from the film. Preferably, separation occurs while the film is being pulled downward against the plate member.

The die removal apparatus according to the present invention may also include a vacuum head which is positionable above a select die. The vacuum head pulls the die from the carrier film upon activation of a vacuum source to pull a substantial portion of the film away from the back side of the die. When combined with the significantly reduced adhesion area of the film to the die, very little force is required to remove the die from the carrier film. Further, because the die rests securely upon and remains supported by the plate member, tilting of the die is unlikely.

The die removal apparatus may also comprise a low-impact plunge-up head which is positionable beneath a selected die and has one or more needles which may be extended upwardly therefrom in a telescoping manner. After the plunge-up head is positioned beneath the select die, the needle is actuated to push the die away from the carrier film. When combined with the significantly reduced adhesion area of the film to the die, afforded by the previously-mentioned base construction and application of vacuum to the back side of the film, very little force is required to remove the die from the carrier film. Preferably, the plunge-up head is used in combination with a vacuum head which is positionable above the select die. Preferably, when used in combination, as the plunge-up head needle pushes the die upward, the vacuum head simultaneously lifts the die to transfer it to another location. As with the first embodiment of the removal mechanism, the likelihood of damaging a select die is much less than that of methods which were previously known in the art.

Other advantages of the present invention will become apparent to those of ordinary skill in the art through a consideration of the appended drawings and the ensuing description.

DETAILED DESCRIPTION OF THE PREFERRED EMBODIMENTS

Figure 1A:
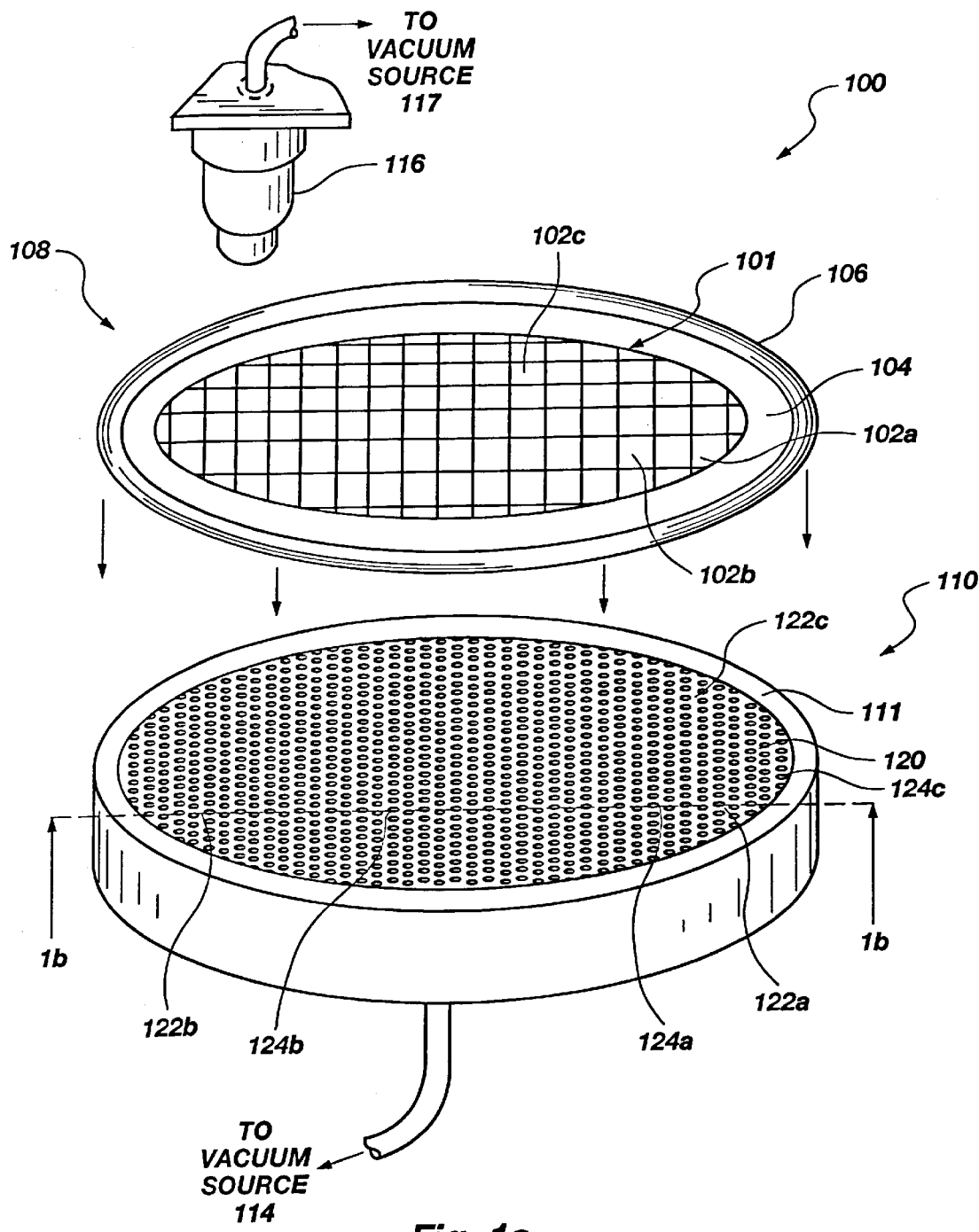
FIG. 1a is a perspective view of a preferred embodiment of the present invention.
Figure 1B:
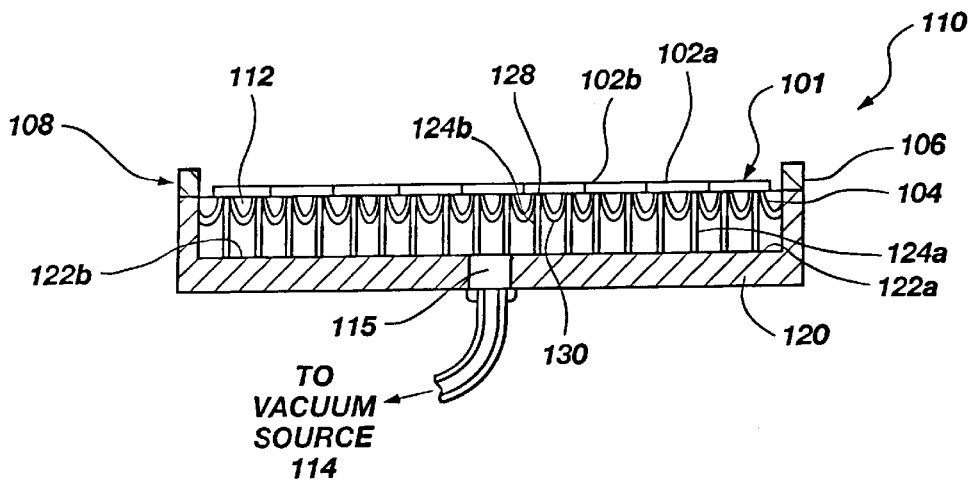
FIG. 1b is a cross-section of the base of the present invention, taken along line 1b—1b of FIG. 1a and showing an assembly including a frame ring, carrier film and a sawed wafer on the carrier film.

With reference to FIGS. 1a and 1b, a first preferred embodiment 100 of the low-stress die removal apparatus of the present invention is shown. Apparatus 100 includes a base 110, including a plate member 120, a screen 112 positioned over the plate member, and a vacuum source 114 connected to the base beneath the plate member. Preferably, embodiment 100 also includes a vacuum pick-up head 116, positioned above base 110. Vacuum pick-up head 116 is also operably connected to a vacuum source 117, which may comprise vacuum source 114 or a second vacuum source.

FIGS. 1a and 1b also depict a diced wafer 101 disposed upon a carrier film 104, which may also be referred to as a carrier tape, film, or tape. Diced wafer 101 includes several singulated dice 102a, 102b, 102c, etc. A frame 106, also referred to as a ring or a frame ring, supports carrier film 104 under tension for transport of wafer 101. Preferably, frame 106 has a shape and dimensions which facilitate placement upon and connection with the top of base 110. Preferably, in embodiments of the invention where a plunge-up head 550 (FIGS. 6 and 7) is employed, the perimeter ring 111 of base 110 is of similar size to frame ring 106, there being enough lateral clearance between the perimeter ring and the periphery of wafer 101 for the plunge-up head to operate. The foregoing elements are collectively referred to as wafer assembly 108.

Base 110 includes a plate member 120 having an uneven, or bumpy surface, which includes a plurality of raised members 124a, 124b, 124c, etc. extending upwardly from the surface of the plate member, which may also be referred to as supports. Spaces 122a, 122b, 122c, etc. are formed between supports 124a, 124b, 124c, etc. Although FIG. 1a shows supports 124a, 124b, 124c, etc. in a staggered arrangement, the supports may also be configured in straight rows or in any other configuration which facilitates removal of carrier film 104 from a die 102 while adequately supporting the die. Similarly, while the top of each of the supports 124 shown in FIG. 1a has a small surface area, other configurations of supports are also within the scope of the apparatus of the present invention, including, without limitation, horizontally elongate supports, larger supports having a shaped (e.g., circular, square, rectangular, triangular, oval, n-sided polygonal and others) orthogonal cross-section with a hollow center, concentrically arranged shaped supports, and other configurations of supports. The shape, the arrangement and the spacing of supports 124 are preferably sufficient to facilitate pulling a significant portion of carrier film 104 from each of dice 102. Yet, the shape, arrangement and spacing of supports must also adequately support each of the dice 102 and reduce the likelihood of fracturing or otherwise damaging the die as portions of the film are removed therefrom by a vacuum.

Referring to FIG. 1b, screen 112, which is preferably flexible, rests above plate member 120. Supports 124a, 124b, 124c, etc. and spaces 122a, 122b, 122c, etc. impart screen 112 with an uneven surface, which includes peaks 128 and valleys 130. Suitable materials for manufacturing screen 112 include, but are not limited to, wire mesh, silk screens, thin layers with a plurality of fenestrations formed therethrough, and other meshes and screens which permit the flow of air therethrough. Woven as well as punched screen materials may be employed. Anti-static materials are preferred.

Vacuum source 114 is operatively connected to base 110 through vacuum port 115. As vacuum source 114 is activated, air is pulled through screen 112 and the carrier film 104 is pulled away from the dice 102 until it contacts the screen material. Thus, vacuum source 114 facilitates the removal of the portions of carrier film 104 which overlie valleys 130 from the backs of dice 102.

Figure 2A:
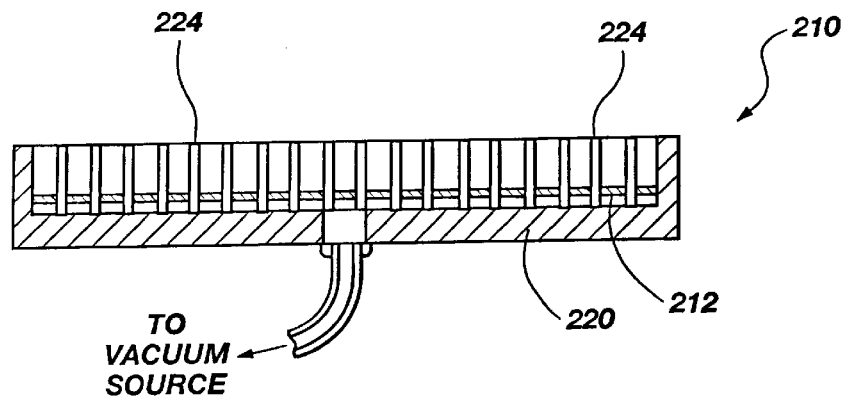
FIG. 2a is a cross-sectional view of a second variation of a base of an apparatus A according to the present invention.

FIG. 2a illustrates an alternate variation of base 210, wherein the screen 212 is a substantially flat member positioned above plate member 220. Plate member 220 includes supports, also referred to as raised members 224, extending upward therefrom through the screen, and forming a bumpy, or uneven surface above the plate member. Supports may be arranged in straight rows, staggered, or in any other configuration which facilitates removal of the carrier film from the dice while adequately supporting the dice.

Figure 2B:
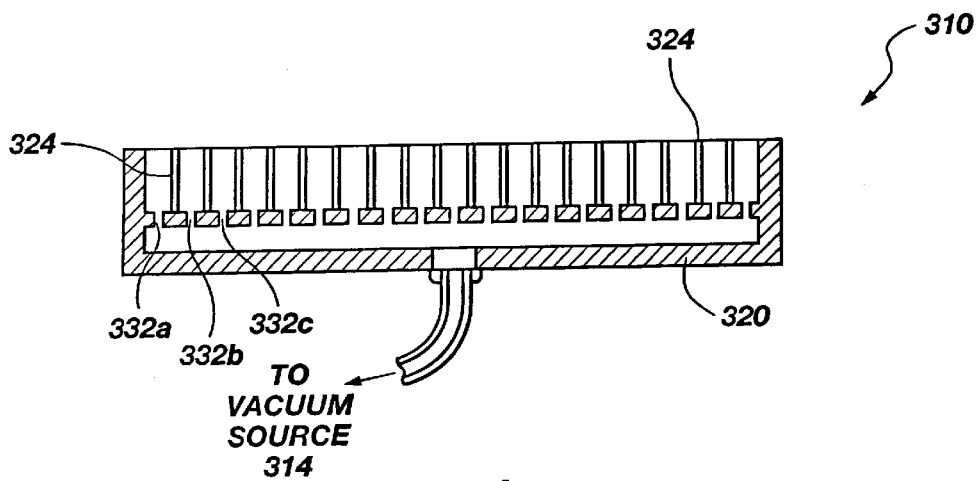
FIG. 2b is a cross-sectional view of a third variation of a base of an apparatus according to the present invention.

FIG. 2b depicts a third variation 310 of the base, which includes a plate member 320 with a plurality of vacuum orifices 332a, 332b, 332c, etc. formed therethrough. Each of vacuum orifices 332a, 332b, 332c, etc. is are operably connected to a vacuum source 314. Preferably, vacuum orifices 332 are consistently spaced over substantially the entire surface of plate member 320. Embodiment 310 also includes supports, or raised members 324, extending upwardly from the surface of plate member 320 to create an uneven surface thereon.

Figure 2C:
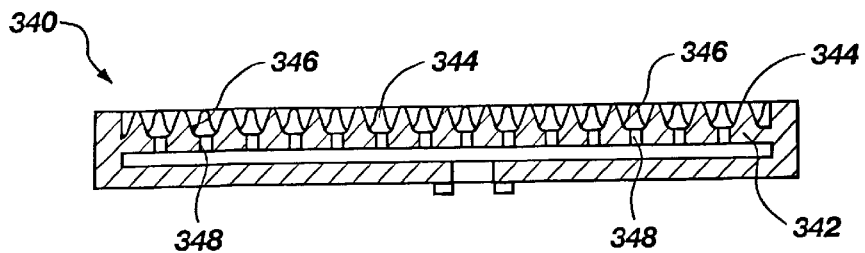
FIG. 2c is a cross-sectional view of a fourth variation of a base of an apparatus according to the present invention.

FIG. 2c depicts a fourth variation 340 of the base, wherein plate member 342 has a substantially flat bottom surface and an uneven top surface having a plurality of peaks 344 and valleys 346 formed thereon. Plate member 342 may also include vacuum orifices 348 formed therethrough which, upon activation of a vacuum source (not shown), facilitate the removal of gas from valleys 346. Alternatively, the vacuum source may connect to outside of the base through the sidewall thereof and adjacent the bottom, as long as the peaks 344 are higher than the distance a carrier film may be drawn thereinto.

Figure 2D:
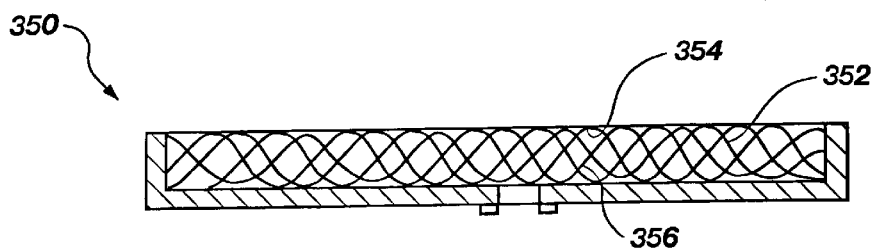
FIG. 2d is a cross-sectional view of a fifth variation of a base of an apparatus according to the present invention.

FIG. 2d illustrates a fifth variation 350 of the base, which includes a self-supporting, highly convoluted screen 352, which includes a plurality of peaks 354 and valleys 356. Screen 352 may be manufactured from the same materials as those described above in reference to screen 112 of FIG. 1b. As used herein, the term "screen" not only encompasses screens having transversely dispersed woven elements, but may comprise a plurality of convoluted elongated elements extending in mutually parallel relationships, preferably with offset peaks and valleys in adjacent elements. Also, in an embodiment employing a screen without associated discrete supports, it will be understood that the laterally-spaced peaks or protrusions of the screen comprise laterally-spaced supports.

Figure 2E:
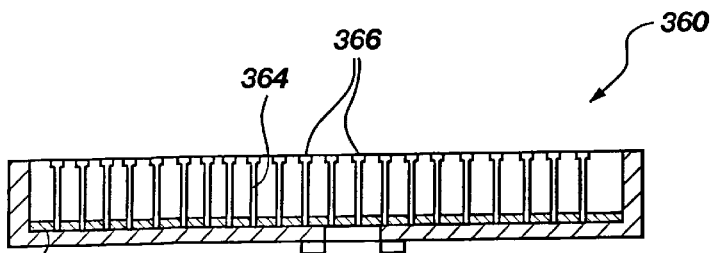
FIG. 2e is a cross-sectional view of a sixth variation of a base of an apparatus according to the present invention.

FIG. 2e shows a sixth variation 360 of the base, which includes a plate member 362 with a plurality of upwardly extending support pins 364 thereon. Each of the support pins 364 includes an enlarged head 366 at the top thereof, against which a carrier film may be drawn.

Figure 3:
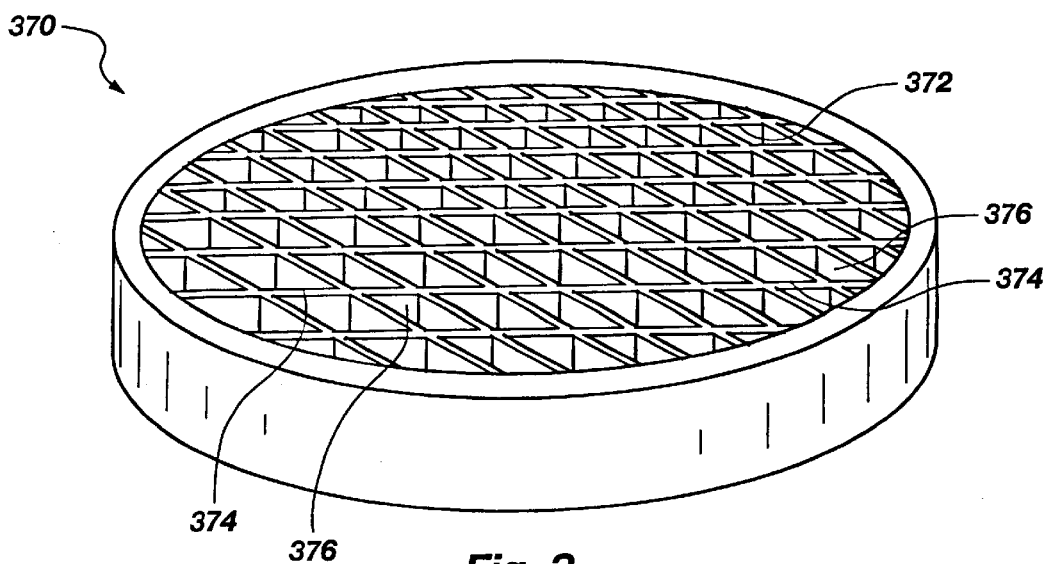
FIG. 3 is a frontal perspective view of another variation of a base of an apparatus according to the present invention.

Referring now to FIG. 3, another variation 370 of the base is shown. Base 370 includes a plate member 372 which has a plurality of apertures 376 formed therethrough. A wafer assembly (not shown) is supported on supports 374, which are located between adjacent apertures 376 of plate member 372. Preferably, supports 374 are narrow members. Apertures 376, which impart plate member 372 with a honeycomb-like appearance, may have any shape, including, without limitation, circular, hexagonal, square, oval, and other shapes. Further, the walls defining the aperture may be undercut, as shown in broken lines, to permit the film to be drawn lower in select areas.

Referring again to FIG. 1b, as an example of the use of the base 110 of the apparatus of the present invention, the carrier film or film 104, upon which a sawed, processed wafer 101 is positioned, is placed upon the base over screen 112. Frame ring 106 secures wafer assembly 108 to base 110. Next, vacuum source 114 is activated, pulling air through the spaces 122, which pulls portions of carrier film 104 against the surfaces of screen 112 which overlay the recesses, releasing those portions of the film from dice 102. Selected dice are then ready for removal from carrier film 104. As defined herein, the terms "select die" and "selected die" refer to a die which has been selected for removal from sawed wafer 101 for further processing. In systems where embodiments 210, 310, or other embodiments of the base of the present invention are employed, the methods for removing portions of the carrier film from the dice are substantially the same.

Figure 4:
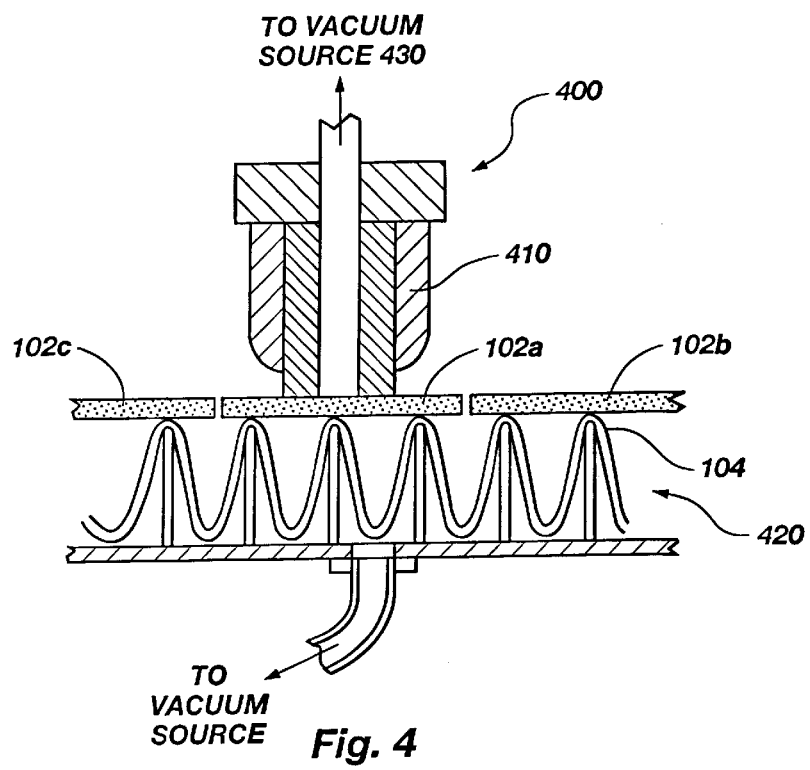
FIG. 4 is a cross-sectional view of an apparatus according to the present invention, also showing a first preferred embodiment of a die removal mechanism.

Referring now to FIG. 4, an embodiment 400 of a die removal mechanism is shown. Embodiment 400 includes a vacuum head 410, which is positionable over a base 420 and operatively connected to a vacuum source 430. Several dice 102a, 102b, 102c, etc., which are disposed upon a carrier film 104, are shown. Vacuum head 410 is positionable directly above a select die 102a. Systems which select dice, track select dice, and position a vacuum head above a select die, are each well known in the industry and are useful in connection with the apparatus of the present invention. Upon activation of vacuum source 430, vacuum head 410 utilizes a vacuum to pull select die 102a upward from carrier film 104. Vacuum die pick-up mechanisms, which are well known and currently used in the industry, are useful in the system of the present invention.

Figure 5:
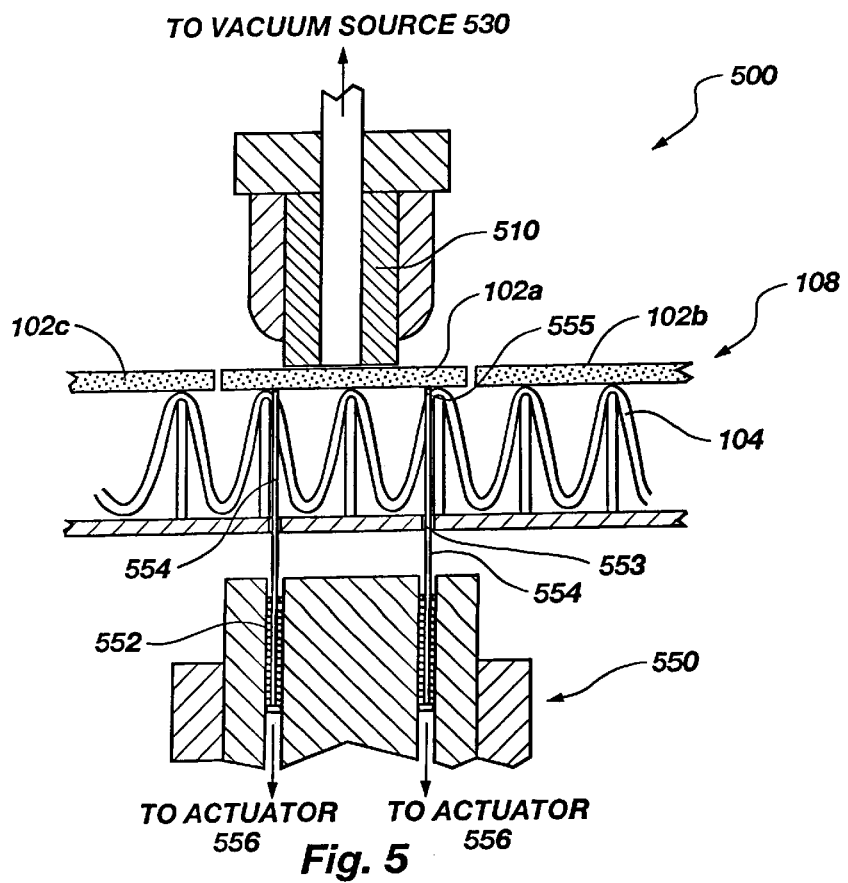
FIG. 5 is a cross-sectional view of an apparatus according to the present invention, illustrating a second preferred embodiment of a die removal mechanism.

FIG. 5 shows another embodiment of a die removal mechanism 500, according to the present invention, which includes a vacuum head 510 and a die plunge-up head, also referred to as striking mechanism 550. FIG. 5 also shows several dice 102a, 102b, 102c, etc. disposed upon a carrier film 104. The carrier film 104 is secured by a frame ring (not shown). Preferably, vacuum head 510 operates in substantially the same manner as that described above in reference to FIG. 4.

Die plunge-up head 550 is of the type known and commonly used in the industry. Die-plunge up head 550, which is positionable beneath a select die 102a, includes one or more needles 554 slidingly disposed within a holder 552. Plunge-up head 550 also includes an actuator 556 disposed behind needle 554. Preferably, the size of plunge-up head 550 is sufficient to include a plurality of needles 554, reducing the tendency of a die 102 to tilt as the needles strike the die. Systems for selecting good dice, tracking select dice, and positioning plunge-up head 550 beneath a select die 102a are well known in the industry and may be used in connection with the apparatus of the present invention. Alternatively, the plunge-up head 550 may include another plunge- up mechanism such as a piston or a pressurized air line.

Actuators which are useful with die plunge up head 550 include, without limitation, conventional two-way pneumatic actuators and solenoid actuators, such as those which are known and used in the industry, or any other type of actuator adaptable for use with plunge-up head 550. Actuator 556 forces needle 554 upward with the appropriate amount of force and for the appropriate time period to, either directly or indirectly, further loosen select die 102a from carrier film 104 without damaging the select die, then retract the needle into holder 552. Preferably, in embodiments of the present invention, needle 554 extends through a base aperture 553 to directly contact select die 102a.

Figure 5A:
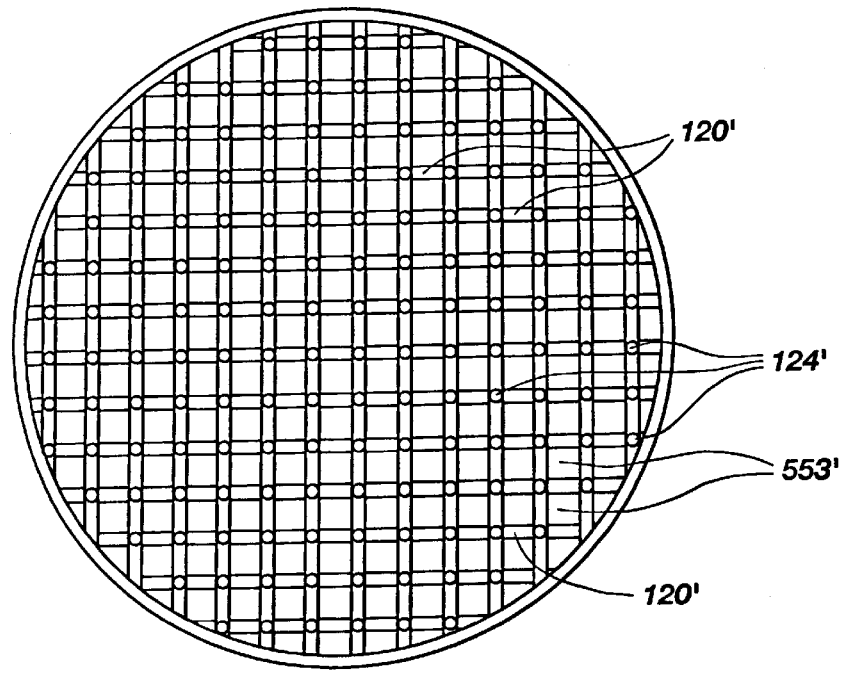
FIG. 5a is a top plan view of a variation of a support plate of the present invention.

FIG. 5 illustrates small base apertures 553. However, as FIG. 5a shows, the plate member 120' may have a grid configuration. Support members 124' extend upwardly from intersecting portions of plate member 120', while large apertures 553' are formed through plate member 120' in the spaces between the support members 124'.

Preferably, the needle has a raised tip with a convex tip surface, or an otherwise blunt tip 555, which decreases the tendency of the needle to score the underside of the select die during actuation of the needle and contact of the needle with the select die, collectively referred to as "striking" the die. In embodiments of the present invention where striking occurs while the frame, film and sawed wafer assembly (reference character 108 in FIG. 1a) is positioned over the base, blunt tip 555 also prevents perforation of carrier film 104 during striking. Perforation of carrier film 104 could cause a loss of the vacuum that pulls the film away from the dice 102. In such embodiments, needles 554 pass through the plate member and/or the screen during striking.

Turning again to FIG. 1a, the preferred dimensions of frame ring 106 are such that the distance between the outer periphery of wafer 101 and the inner surface of the frame permits the plunge-up head 550 (see FIGS. 6 and 7) to further remove carrier film 104 from the outermost complete dice without contacting the frame.

Figure 6:
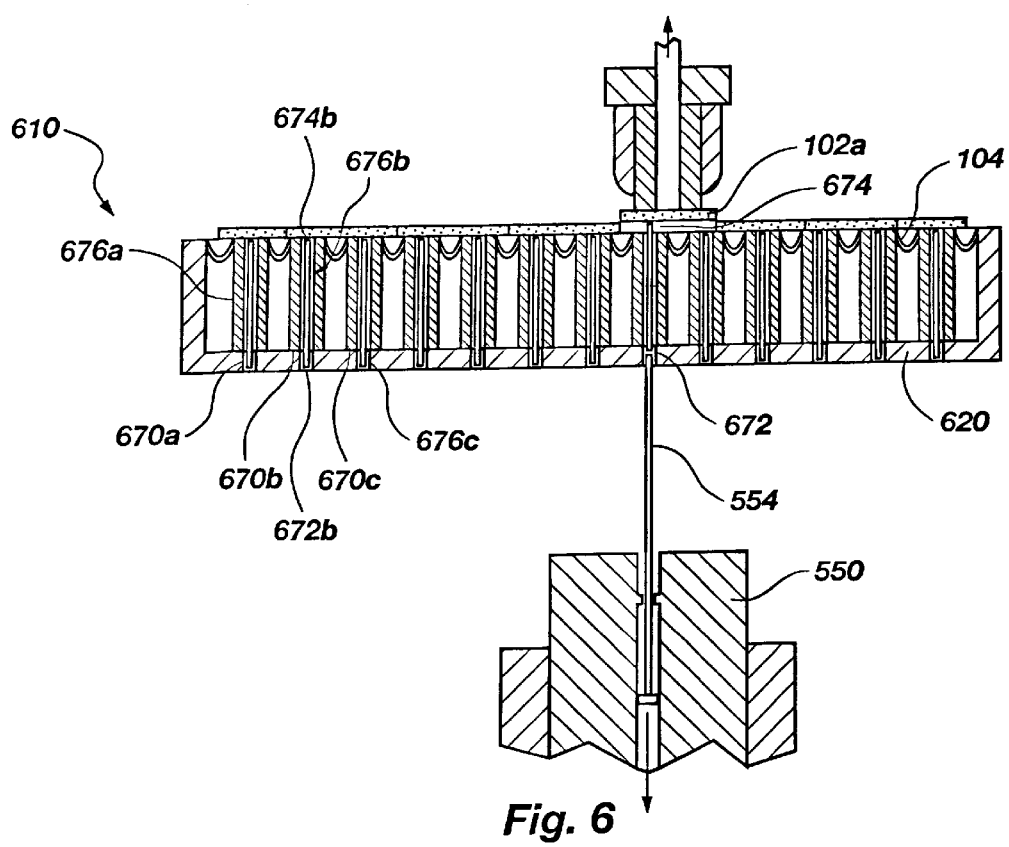
FIG. 6 is a cross-sectional view of a die removal mechanism according to the present invention.

Preferably, in operation, the plunge-up head does not disrupt the vacuum which pulls portions of the carrier film from the dice. Thus, as FIG. 6 illustrates, a preferred embodiment of base 610 includes an array of base needles 670a, 670b, 670c, etc. therein, each of which are slidingly engaged within needle ports 676a, 676b, 676c, etc., respectively. Needle ports 676 are each formed through plate member 620. Each base needle 670 includes an actuation end 672 and a needle tip 674. The actuation end 672 of each base needle 670 is preferably exposed to the lower, outer surface of plate member 620. Preferably, tip 674 of each base needle is raised, with a convex surface, or otherwise blunt to prevent scoring of a select die 102a as the needle tip comes into contact with the select die. Blunt needle tip 674 also prevents perforation of carrier film 104 as needle 670 is actuated, which facilitates maintenance of the vacuum which pulls portions of the film away from dice 102. Preferably, each base needle 670 needle port 676 assembly is sealed in order to maintain the vacuum which has been created in base 610. Alternatively, a positive pressure collett could be employed in place of a plunge-up head by directing pressurized air upward against needle 670 to drive the needle against select die 102a.

As an example of the operation of plunge up head 550 in the present embodiment of base 610, the plunge-up head is positioned beneath the base needle 670 or base needles located beneath select die 102a. As the plunge-up head needle 554 is actuated, it moves upward, contacts actuation end 672 of base needle 670, and forces the base needle upward against the select die to further loosen the select die from carrier film 104.

Figure 7:
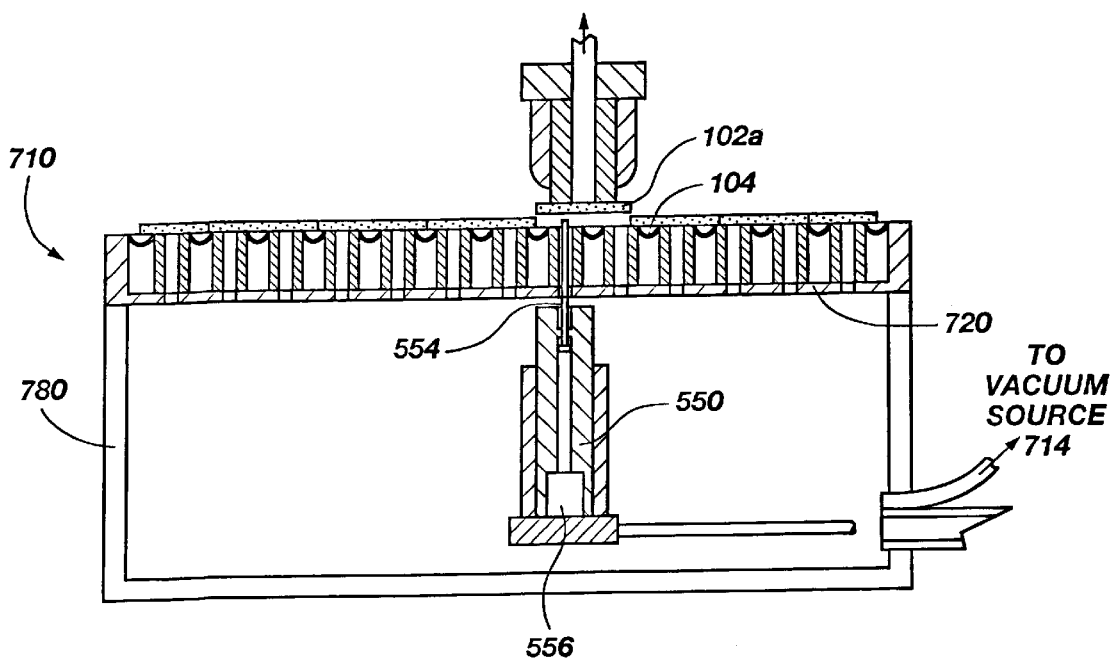
FIG. 7 is a cross-sectional view of a second die removal mechanism of this invention.

With reference to FIG. 7, another preferred embodiment of base 710 includes a sealed plunge-up head housing 780, within which plunge up head 550 is disposed. In addition to creating a vacuum within the base, vacuum source 714 creates a vacuum within plunge-up head housing 780.

Plunge-up head 550 is repositionable within housing 780 without disrupting the vacuum therein. Thus, base 710 permits direct contact of needle 554 through plate member 720 and the screen thereon, if any, with select die 102*a* to further remove the select die from carrier film 104.

Figure 8:
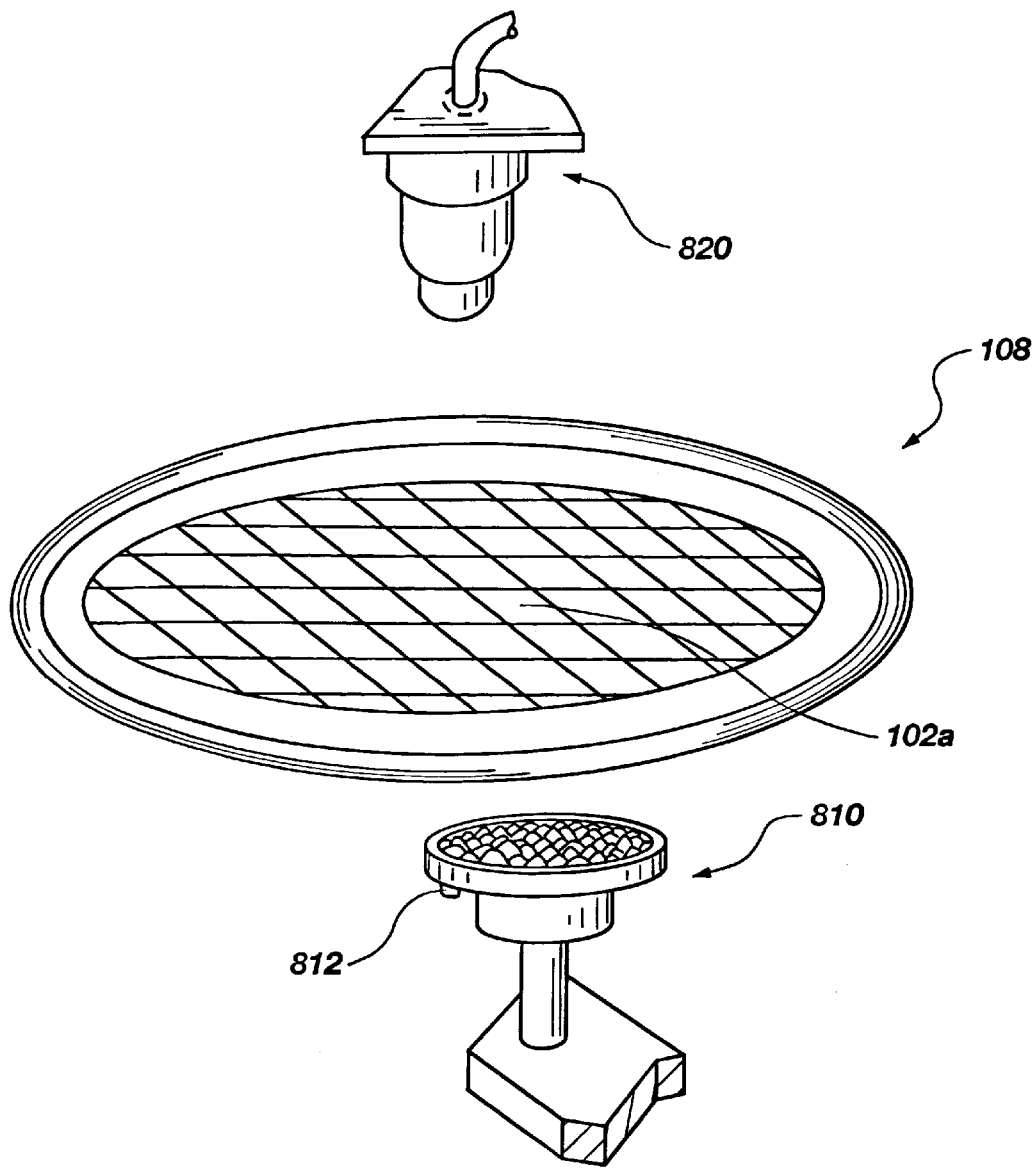
FIG. 8 is a frontal perspective view of a variation of the base of the present invention, wherein the base is positionable relative to a select die.

With reference to FIG. 8, another embodiment of the apparatus of the present invention includes a small base 810, including an uneven film removal surface as described above in reference to FIGS. 1*b*, 2*a* through 2*e* and 3. Base 810 is positionable beneath a select die 102*a* on a wafer assembly 108 using known apparatus and methods. Base 810 is attachable to a vacuum source (not shown) at connector 812. A die pick-up mechanism 820, as described above in reference to FIG. 4, may also be used in connection with positionable base 810.

In use, positionable base 810 is oriented beneath select die 102*a* and positioned in close proximity to the carrier film attached to the select die. The vacuum source is actuated, pulling air from the lower areas of the base and removing portions of the carrier film from select die 102*a*, thereby reducing the adhesion of the film to the die. If desired, the vacuum may be applied continuously, the base then sliding laterally to different locations beneath the carrier film. Die pick-up mechanism 820 then completely removes select die 102*a* from the carrier film.

Figure 8A:
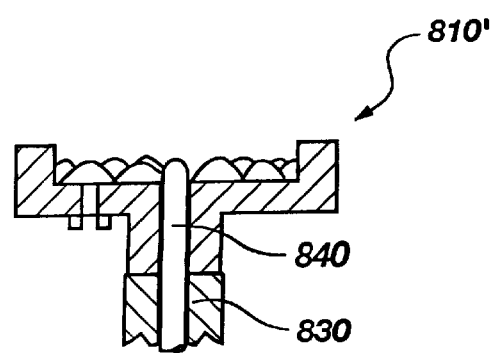
FIG. 8a is a frontal perspective view of another variation of the base of the present invention, wherein the base is positionable relative to a select die.

FIG. 8*a* shows an alternative embodiment 810' of a positionable base. Base 810' is adapted to fit over a die plunge-up mechanism 830, having a needle 840, piston, pressurized air line, or other plunge-up mechanism therein.

Referring again to FIG. 5, as an example of the use of embodiment 500 of die removal mechanism, vacuum head 510 is positioned above a select die 102*a* and plunge-up head 550 is positioned beneath the select die. Vacuum head 510 is lowered toward select die 102*a*. Plunge-up head 550 is raised to an appropriate position beneath select die 102*a*. Vacuum source 530 is activated to direct a vacuum through vacuum head 510 and at the exposed surface of select die 102*a*. Preferably, while vacuum head 510 is pulling die 102*a*, needle 554 is actuated by actuator 556 to strike the select die and further remove carrier film 104 from the select die. In embodiments of the present method wherein removal of select die 102*a* occurs while wafer assembly 108 is disposed upon the base, each needle 554 passes through the plate member and the screen, if any, during striking. Vacuum head 510 is then raised while holding die 102*a*, and transfers the select die to a desired location. When embodiment 610 of the base, discussed above in reference to FIG. 6, is used in the present method, needle 554 contacts actuation end 672 of the appropriate base needle 670, which contacts carrier film 104 beneath select die 102*a* to further remove the film from the die.

Inexpensive carrier films may be used with the present invention in lieu of those coated with UV-degradeable or other expensive adhesives, or adhesives which contaminate the dice. For example, the pressure sensitive adhesive-coated polymer films manufactured by Shinkawa and Nitto, both of Japan, which are used for protectively coating sheet steel, are particularly useful in the invented system. Such films are desirable for use because of their low cost and chemical cleanliness (i.e., will not contaminate dice), both of which advantages provide a reduction in manufacturing costs.

Another consequent advantage of the invention is that the likelihood of dropping, contaminating, fracturing or otherwise damaging the die is much reduced when compared with methods which were previously known in the art.

While the invention has been described in terms of a vacuum drawing the carrier film down and away from the dice supported thereon, those of ordinary skill in the art will recognize that it is a pressure differential which effects movement of the film. Accordingly, it is also contemplated that a higher (positive) pressure may be applied to the top of the carrier film to "push" the film downward against ambient pressure therebelow. Specifically, a push-up head may be employed within a bell-type chamber placed over the frame ring and carrier film to effect withdrawal of large portions of the film from the dice.

Although the foregoing description contains many specificities, these should not be construed as limiting the scope of the present invention, but as merely providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. Additions, deletions and modifications to the embodiments of the invention as disclosed, and the combination of features of different embodiments, are specifically contemplated as falling within the scope of the invention.

What is claimed is:

1. A system for releasing at least a portion of a carrier film from at least one selected semiconductor die, comprising:
    a base including a plate member configured to be moved laterally within a periphery of a frame supporting the carrier film having a semiconductor wafer adhered thereto, said plate member including a plurality of supports disposed within said periphery, positionable below the carrier film, and sufficiently mutually laterally spaced to permit deflection of portions of the carrier film therebetween responsive to a pressure differential across the carrier film;
    a vacuum source operatively connected with said base to create a vacuum between said plurality of supports; and
    a die pick up mechanism, said die pick-up mechanism being laterally positionable proximate to said plate member in a plurality of locations on an opposite side of the carrier film from the plurality of supports.

2. The system according to claim 1, wherein said die pick-up mechanism employs a vacuum.

3. The system of claim 1, further comprising a base positioning mechanism for moving said base parallel to a carrier film disposed adjacent thereto.

4. The system of claim 3, wherein said base positioning mechanism positions said base beneath the at least one selected semiconductor die.

5. The system of claim 1, wherein selected ones of said plurality of supports are discrete from one another.

6. An apparatus for releasing at least a portion of a carrier film from at least one semiconductor die adhered thereto, comprising:
    a base member including a plate member and a raised periphery thereabout configured to engage a peripheral frame supporting the carrier film having the at least one semiconductor die adhered thereto; and
    a perforated screen comprising a plurality of supports disposed on said plate member, within the base member periphery said plurality of supports of said perforated screen being sufficiently mutually laterally spaced to permit deflection of portions of the carrier film therebetween responsive to a pressure differential across the carrier film.

7. The apparatus according to claim 6, wherein said base member further includes a vacuum port therethrough.

8. The apparatus according to claim 6, wherein said plurality of supports comprises a plurality of raised members extending upwardly from said plate member, each of said plurality of raised members extending approximately the same distance from said plate member.

9. The apparatus according to claim 6, wherein said perforated screen includes a plurality of peaks and a plurality of valleys.

10. The apparatus according to claim 9, wherein said perforated screen is configured so that said plurality of valleys are located between said plurality of supports.

11. The apparatus according to claim 6, wherein said plate member includes a plurality of fenestrations.

12. The mechanism according to claim 11, wherein said plurality of supports are positioned between said plurality of fenestrations.

13. The apparatus according to claim 6, further comprising a device for removing a single die from a carrier film disposed proximate said plate member.

14. An apparatus for releasing at least a portion of a carrier film from at least one semiconductor die adhered thereto, comprising:

a base member including a plate member and a raised periphery thereabout configured to engage a peripheral frame supporting the carrier film having the at least one semiconductor die adhered thereto;

a perforated screen disposed on said plate member, said perforated screen including a plurality of peaks and valleys, said plurality of peaks forming a plurality of supports disposed on said plate member, within the base member periphery and sufficiently mutually laterally spaced to permit deflection of portions of the carrier film therebetween responsive to a pressure differential across the carrier film.

* * * * *

UNITED STATES PATENT AND TRADEMARK OFFICE
CERTIFICATE OF CORRECTION

PATENT NO. : 6,202,292 B1
DATED : March 20, 2001
INVENTOR(S) : Warren M. Farnworth and Rockwell Smith It is certified that error appears in the above-identified patent and that said Letters Patent is hereby corrected as shown below:

<u>Title page, Item [54] and Column 1, line 1,</u>
After "REMOVING" insert -- A --

<u>Column 1,</u>
Line 26, after "discloses" insert -- a --
Line 61, change "Safabakhah" to -- Safabakhsh --
Line 65, change "collett" to -- collet --.

<u>Column 2,</u>
Line 30, change "are" to -- is --

<u>Column 3,</u>
Line 1, after "fragments" insert -- , --

<u>Column 4,</u>
Line 40, delete "A"

<u>Column 5,</u>
Line 31, delete the "," after "uneven"

<u>Column 6,</u>
Line 13, delete the "," after "bumpy"
Line 21, delete "are"

<u>Column 7,</u>
Line 60, change "plunge up" to -- plunge-up --

<u>Column 8,</u>
Line 50, change "collett" to -- collet --
Lines 54 and 64, change "plunge up" to -- plunge-up --

UNITED STATES PATENT AND TRADEMARK OFFICE
CERTIFICATE OF CORRECTION

PATENT NO. : 6,202,292 B1
DATED : March 20, 2001
INVENTOR(S) : Warren M. Farnworth and Rockwell Smith It is certified that error appears in the above-identified patent and that said Letters Patent is hereby corrected as shown below:

Column 9,
Line 32, change "plunge- up" to -- plunge-up --

Column 10,
Line 39, change "pick up" to -- pick-up --

Column 11,
Line 18, change "mechanism" to -- apparatus --

Signed and Sealed this

Fourteenth Day of January, 2003

JAMES E. ROGAN
*Director of the United States Patent and Trademark Office*